(12) United States Patent
Han et al.

(10) Patent No.: US 12,317,453 B2
(45) Date of Patent: May 27, 2025

(54) UNDERWATER DATA CENTER

(71) Applicant: Korea Institute of Ocean Science & Technology, Busan (KR)

(72) Inventors: Taek Hee Han, Busan (KR); Hye Min Hong, Busan (KR); Jun Kil Park, Busan (KR)

(73) Assignee: Korea Institute of Ocean Science & Technology, Busan (KR)

( * ) Notice: Subject to any disclaimer, the term of this patent is extended or adjusted under 35 U.S.C. 154(b) by 113 days.

(21) Appl. No.: 18/084,764

(22) Filed: Dec. 20, 2022

(65) Prior Publication Data

US 2024/0121917 A1 Apr. 11, 2024

(30) Foreign Application Priority Data

Oct. 5, 2022 (KR) .................. 10-2022-0127266

(51) Int. Cl.
*H05K 7/20* (2006.01)
(52) U.S. Cl.
CPC .................. *H05K 7/20409* (2013.01)

(58) Field of Classification Search
CPC .......... H05K 7/20409; H05K 7/20709; H05K 7/20763; H05K 5/0217; H05K 5/03
See application file for complete search history.

(56) References Cited

U.S. PATENT DOCUMENTS

| | | | |
|---|---|---|---|
| 9,844,167 B2 * | 12/2017 | Peterson | ................... F25D 1/02 |
| 10,136,562 B2 * | 11/2018 | Kosugi | ................ H05K 7/1497 |
| 10,285,309 B2 * | 5/2019 | James | ................ H05K 7/20709 |
| 10,746,476 B2 * | 8/2020 | Jaccard | .................. E02D 29/06 |
| 11,421,921 B2 * | 8/2022 | Smith | ................ H05K 7/20272 |
| 2015/0321739 A1 * | 11/2015 | Dehlsen | ................ B63G 8/001 |
| | | | 165/45 |
| 2018/0054916 A1 * | 2/2018 | Kosugi | ................ H05K 7/2079 |
| 2020/0173729 A1 * | 6/2020 | Jaccard | .............. F28D 15/0275 |
| 2024/0121917 A1 * | 4/2024 | Han | .................. H05K 7/20709 |
| 2024/0125078 A1 * | 4/2024 | Li | .......................... E02D 29/06 |

* cited by examiner

*Primary Examiner* — Lisa Lea-Edmonds
(74) *Attorney, Agent, or Firm* — Bridgeway IP Law Group, PLLC; Jihun Kim

(57) ABSTRACT

Proposed is an underwater data center including: a support fixed to the bottom of the sea; and a body disposed on the support and having data processing servers arranged in an internal space thereof and a plurality of protrusions protruding radially outward from an outer peripheral surface thereof and arranged in a longitudinal direction thereof.

3 Claims, 8 Drawing Sheets

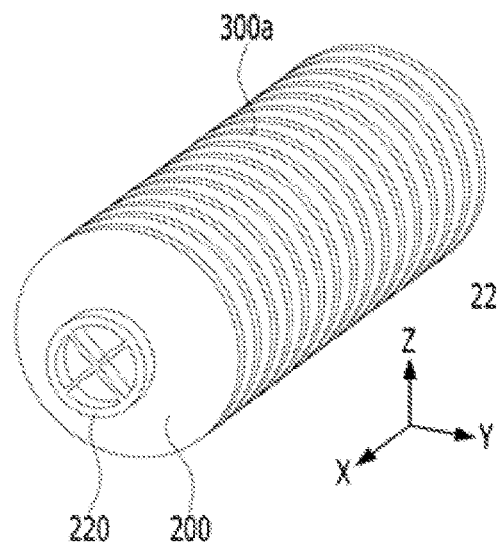 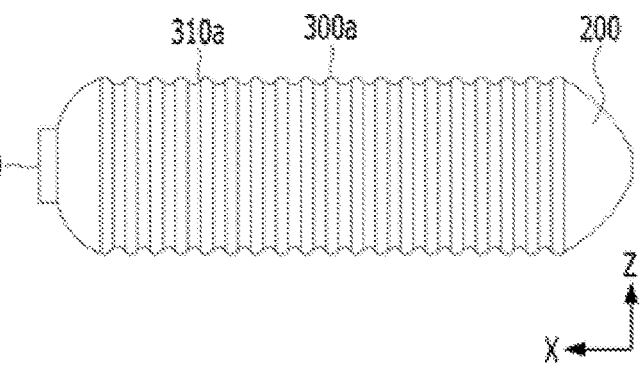
FIG. 3A  FIG. 3B
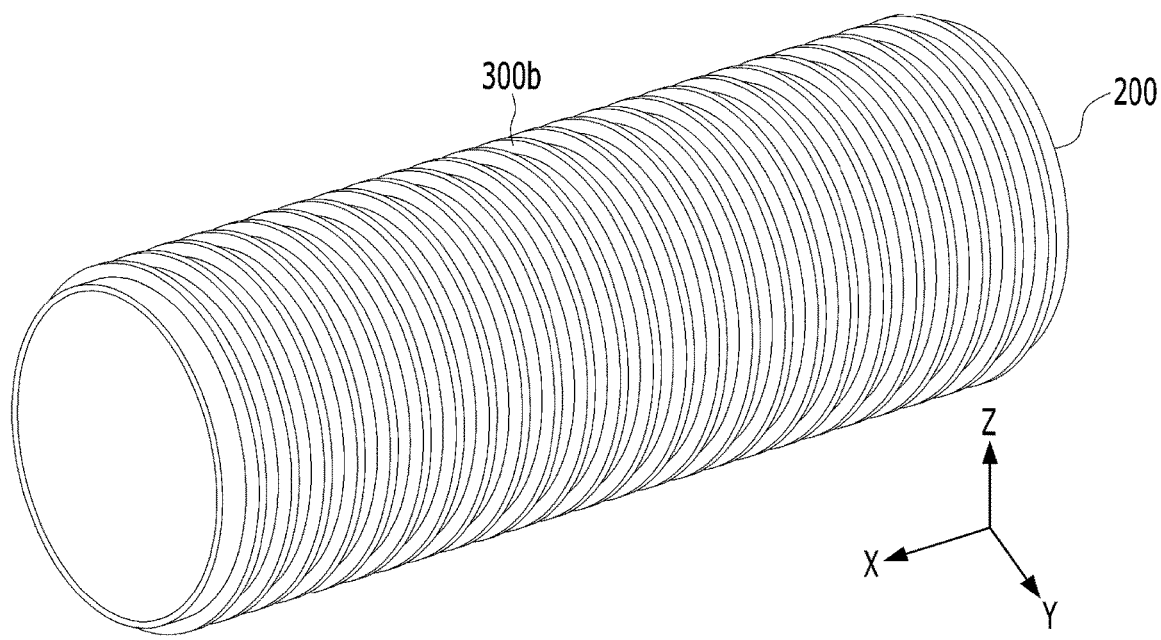
FIG. 4

UNDERWATER DATA CENTER

BACKGROUND OF THE INVENTION

Cross Reference to Related Applications of the Invention

The present application claims the benefit of Korean Patent Application No. 10-2022-0127266 filed in the Korean Intellectual Property Office on Oct. 5, 2022, the entire contents of which are incorporated herein by reference.

FIELD OF THE INVENTION

The present invention relates to a device, and more specifically, to an underwater data center.

BACKGROUND OF THE RELATED ART

Data centers are classified into ground data centers located on the ground and underwater data centers located underwater. The underwater data center includes an exterior part (housing), an opening, and a support structure, and further, data processing servers are disposed inside the exterior part. So as to build the underground data center underwater, the underground data center is mounted on a base, and the base is fixed to the bottom of the sea.

The underwater data center is directly cold by the sea water, so that the heat generated from the entire region of the exterior part is emitted to enable the underwater data center to be kept to a low temperature. The year-round low temperature sea water is continuously provided for the underwater data center, thereby reducing a cooling cost and an amount of power consumed for the underwater data center. Accordingly, the underwater data center has a lower failure rate than the ground data center and performs more eco-friendly heat emission than the ground data center. In this case, there is a need to develop a new underwater data center with an exterior part (housing) increased in surface area so that heat emission performance can be improved.

SUMMARY OF THE INVENTION

Accordingly, the present invention has been made in view of the above-mentioned problems occurring in the related art, and it is an object of the present invention to provide an underwater data center that is capable of improving cooling performance and reducing an amount of power required for cooling.

To accomplish the above-mentioned objects, according to one aspect of the present invention, there is provided an underwater data center including: a support fixed to the bottom of the sea; and a body disposed on the support and having data processing servers arranged in an internal space thereof and a plurality of protrusions protruding radially outward from an outer peripheral surface thereof and arranged in a longitudinal direction thereof.

According to the present invention, desirably, the protrusions may extend along a circumferential direction of the body, while being spaced apart from one another in the longitudinal direction of the body.

According to the present invention, desirably, between the neighboring protrusions may be formed a concave portion formed radially inward.

According to the present invention, desirably, the protrusions may have the shapes of elongated pins and be arranged on the outer peripheral surface of the body in the circumferential direction of the body.

According to the present invention, desirably, the underwater data center may further include a cover adapted to be coupled to the ends of the protrusions to surroundingly cover the outer peripheral surface of the body, while being spaced apart from the body.

To accomplish the above-mentioned objects, according to another aspect of the present invention, there is provided an underwater data center including: a support fixed to the bottom of the sea; and a body disposed on the support and having data processing servers arranged in an internal space thereof and a plurality of protrusions protruding radially outward from an outer peripheral surface thereof and arranged in a circumferential direction thereof.

According to the present invention, desirably, the protrusions may extend along a longitudinal direction of the body, while being spaced apart from one another in the circumferential of the body.

According to the present invention, desirably, the underwater data center may further include a cover adapted to be coupled to the ends of the protrusions to surroundingly cover the outer peripheral surface of the body, while being spaced apart from the body.

According to the present invention, desirably, the body may include, on the outer peripheral surface thereof, a first area on which some of the protrusions are located, a second area spaced apart from the first area in the longitudinal direction thereof to locate the remaining protrusions thereon, and third areas formed between the first area and the second area and on a portion where no protrusions are arranged.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIGS. 3A and 3B are perspective and side views showing one example of the body of the underwater data center according to the present invention;

FIG. 4 is a perspective view showing another example of the body of the underwater data center according to the present invention;

DETAILED DESCRIPTION OF THE PREFERRED EMBODIMENTS

Figure 1:
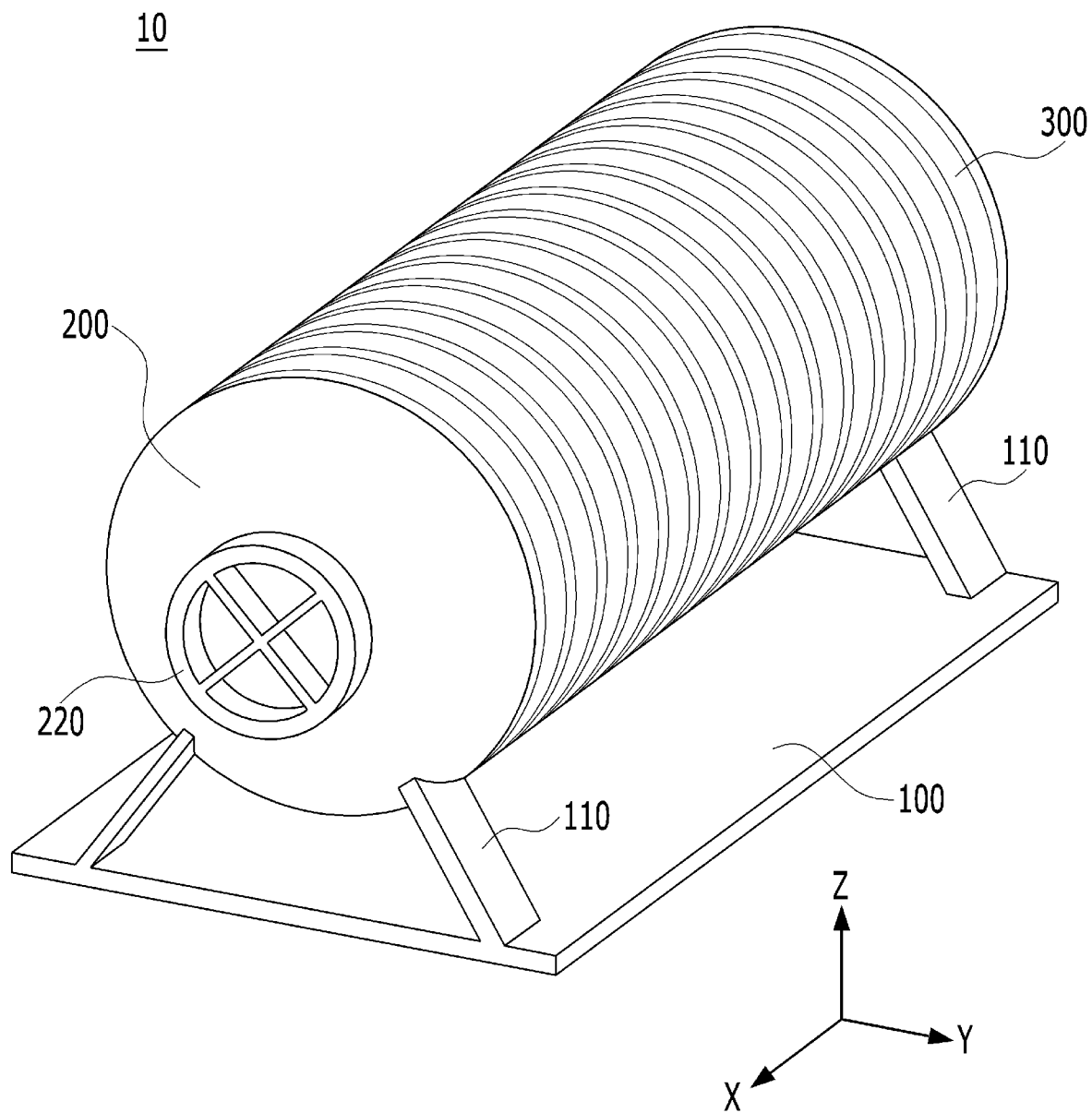
FIG. 1 is a perspective view showing an underwater data center according to the present invention.

Hereinafter, an explanation of the present invention will be given in detail. Before the present invention is disclosed and described, it is to be understood that the disclosed embodiments are merely exemplary of the invention, which can be embodied in various forms. In explaining the example embodiments, detailed description on known elements or functions will be omitted if it is determined that such description will interfere with understanding of the embodiments. In the description, it should be noted that the parts corresponding to those of the drawings are indicated by corresponding reference numerals.

When it is said that one element is described as being "connected" or "coupled" to the other element, one element may be directly connected or coupled to the other element, but it should be understood that another element may be present between the two elements. In the description, when it is said that one portion is described as "includes" any component, one element further may include other components unless no specific description is suggested.

Terms used in this specification are used to only describe specific exemplary embodiments and are not intended to restrict the present invention. An expression referencing a singular value additionally refers to a corresponding expression of the plural number, unless explicitly limited otherwise by the context. In this application, terms, such as "comprise", "include", or "have", are intended to designate those characteristics, numbers, steps, operations, elements, or parts which are described in the specification, or any combination of them that exist, and it should be understood that they do not preclude the possibility of the existence or possible addition of one or more additional characteristics, numbers, steps, operations, elements, or parts, or combinations thereof.

Hereinafter, embodiments of the present invention will be explained in detail with reference to the attached drawings.

Figure 2:
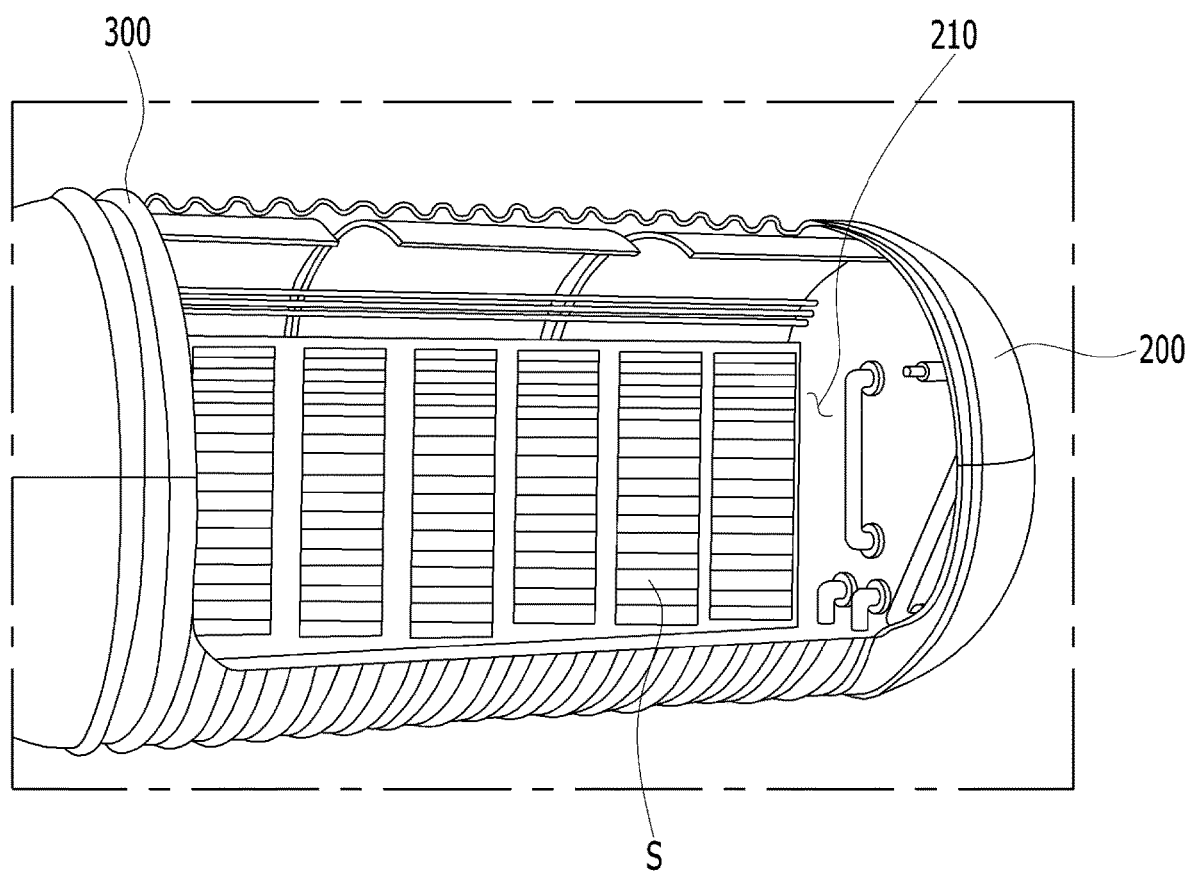
FIG. 2 is a partial cutaway view showing a body and servers arranged in the body in the underwater data center according to the present invention.

FIG. 1 is a perspective view showing an underwater data center according to the present invention, and FIG. 2 is a partial cutaway view showing a body and servers arranged in the body in the underwater data center according to the present invention.

Referring to FIGS. 1 and 2, an underwater data center 10 according to the present invention includes a support 100, a body 200, and protrusions 300. Further, the underwater data center 10 includes a cover 400 (See FIG. 6).

The support 100 is fixedly disposed on the bottom of the sea to support the body 200 of the underwater data center 10. According to the present invention, the support 100 is provided in the form of a plate. In this case, the underside of the support 100 is fixed to the bottom of the sea, and a plurality of support rods 110 are disposed on top of the support 100 to support the body 200.

The body 200 is supportably disposed on tops of the plurality of support rods 110 and serves as a housing in which servers S for data processing are arranged. In specific, the body 200 has an internal space 210 in which the data processing servers S are accommodated.

The body 200 may have various shapes. For example, the body 200 has a cylindrical, parallelepiped, or polygonal cross-sectional shape, but hereinafter, an embodiment wherein the body 200 has the shape of the cylinder with the internal space 210 will be explained.

The body 200 has an opening 220 adapted to allow the internal space 210 to communicate with the outside. The opening 220 is openable and closable so that it can be selectively open and closed. In the drawings, the opening 220 is formed on one end of the body 200, which is just exemplary, and accordingly, the present invention may not be limited thereto.

The protrusions 300 are formed on the outer peripheral surface of the body 200 to expand the surface area of the body 200. The protrusions 300 protrude radially outward from the outer peripheral surface of the body 200. According to the present invention, the protrusions 300 may have various shapes and be arranged in various forms, which will be explained below.

Figure 5A:
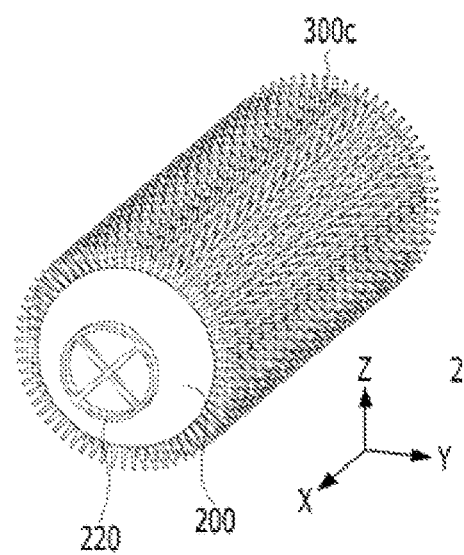
FIGS. 5A and 5B are perspective and side views showing yet another example of the body of the underwater data center according to the present invention.
Figure 5B:
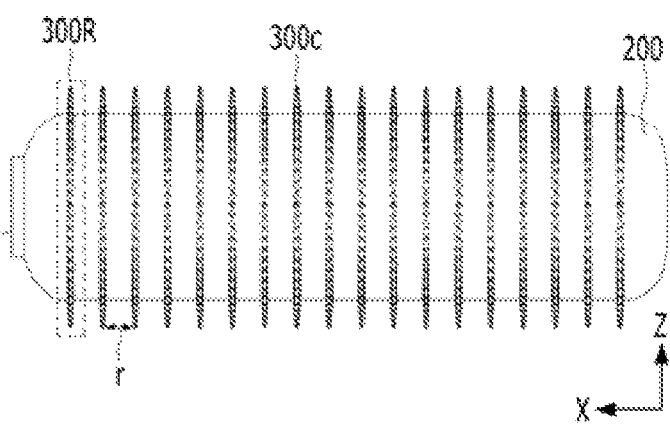
Figure 6:
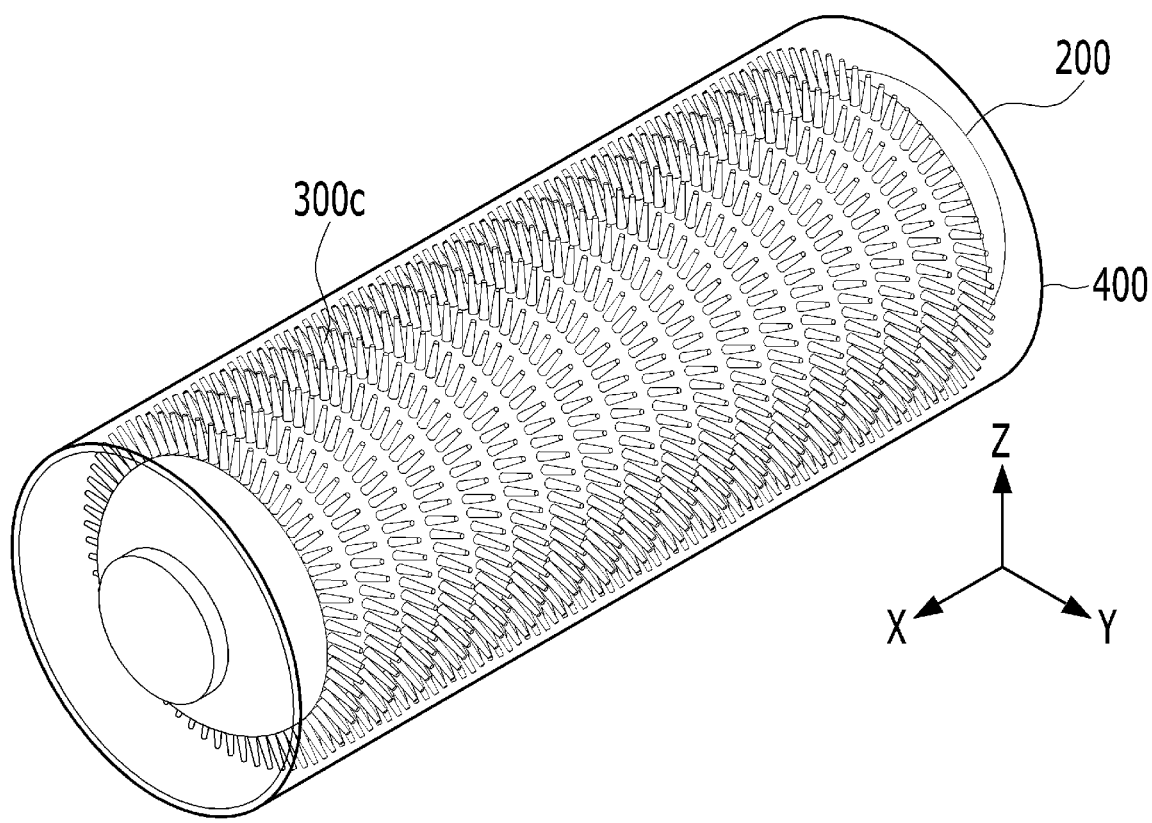
FIG. 6 is a perspective view showing a state where a cover is coupled to the body of FIGS. 5A and 5B.

FIGS. 3A and 3B are perspective and side views showing one example of the body of the underwater data center according to the present invention, and FIG. 4 is a perspective view showing another example of the body of the underwater data center according to the present invention. FIGS. 5A and 5B are perspective and side views showing yet another example of the body of the underwater data center according to the present invention, and FIG. 6 is a perspective view showing a state where a cover part is coupled to the body of FIGS. 5A and 5B.

Referring to FIGS. 3A to 4, protrusions 300a and 300b extend along the circumferential directions of the corresponding bodies 200. In specific, the protrusions 300a and 300b extend along the circumferential directions of the corresponding bodies 200 so that both ends of each protrusion are connected to each other in the form of a ring.

The protrusions 300a and 300b are formed between both ends of the corresponding bodies 200 disposed in longitudinal directions (the directions of X-axes). The protrusions 300a and 300b are arranged along the longitudinal directions of the corresponding bodies 200. In this case, the protrusions 300a and 300b are spaced apart from one another.

As shown in FIGS. 3A and 3B, the protrusions 300a are spaced apart from one another in the longitudinal direction (the direction of an X-axis) of the body 200. According to the present invention, the outermost protrusions may have streamline shapes. In this case, the outermost protrusions are the protrusions 300a formed on the outermost positions in the radial direction with respect to protruding directions of the protrusions 300a.

Further, a concave portion 310a is formed between the neighboring two protrusions 300a. In this case, the concave portion 310 is concavely formed radially inward between the neighboring two protrusions 300a. In this case, the concave portion 310a may have various cross-sectional shapes. When viewed in the direction (for example, a ZX plane) parallel with the side of the body 200, the concave portion 310a has a U-shaped cross-section curved radially inward. However, the present invention may not be limited thereto, and the concave portion 310a may have a V-shaped cross-section bent radially inward.

Accordingly, the body 200 has the plurality of protrusions 300a protruding from the outer peripheral surface thereof and the concave portions 310a formed between the neighboring protrusions 300a, so that the protrusions 300a and the concave portions 310a are alternately arranged on the outer peripheral surface of the body 200. As a result, the surface area of the body 200 coming into contact with the sea water is expanded to improve heat emission performance of the underwater data center 10.

Further, as mentioned above, both outermost protrusions 300a have streamline shapes, and the U-shaped concave portions 310a are formed between the neighboring protrusions 300a. In this case, the sea water can flow along the surfaces of the protrusions 300a and the concave portions 310a alternately arranged to each other. As a result, the heat exchange between the body 200 and the sea water can be performed more actively, thereby greatly improving the heat emission performance of the underwater data center 10.

As shown in FIG. 4, only a plurality of protrusions 300b are formed on the outer peripheral surface of the body 200, without having any concave portions 310a. In this case, the flat outer peripheral surface of the body 200 is located between the neighboring protrusions 300b. The specific characteristics of the protrusions 300b are the same as or similar to the protrusions 300a in the above-mentioned embodiment of the present invention, and therefore, an explanation of the specific characteristics of the protrusions 300b will be avoided.

Referring to FIGS. 5A and 5B, protrusions 300c have the shapes of elongated pins. In this case, one end of each protrusion 300c is connected to the outer peripheral surface of the body 200, and the other end of the protrusion 300c extends protrudingly radially outward from one end thereof.

The plurality of protrusions 300c are arranged on the outer peripheral surface of the body 200 in a circumferential direction, thereby forming a plurality of ring-shaped protrusion arrangement portions 300R. In this case, the plurality of protrusion arrangement portions 300R are arranged between both ends of the body 200 disposed in a longitudinal direction (in the direction of an X-axis). In specific, the plurality of protrusion arrangement portions 300R are spaced apart from one another by a given distance r (hereinafter, referred to as a separation distance) in the longitudinal direction (in the direction of the X-axis) of the body 200. According to the present invention, the separation distance r is greater than a thickness of each protrusion 300c, and for example, the separation distance r is more than two times the thickness of each protrusion 300c. However, the present invention is not limited thereto, and accordingly, the separation distance r is the same as or similar to the thickness of each protrusion 300c.

Referring to FIG. 6, the underwater data center 10 further includes the cover 400. The cover 400 is adapted to surround the body 200 and the protrusions 300c to protect them from the outside.

In specific, the cover 400 serves to cover the body 200 and the protrusions 300c to protect them from the outside. In this case, the cover 400 may be provided with a plurality of unit plates 400' (See FIG. 9) curved to the same or similar curvature radius of the body 200.

According to the present invention, the cover 400 is a cylindrical plate with a hollow portion passing through the center thereof. In this case, the inner peripheral surface of the cover 400 comes into close contact with the ends of the protrusions 300c so that the cover 400 is connected to the body 200. In this case, the cover 400 completely surrounds the outer peripheral surface of the body 200. In specific, the cover 400 is spaced apart from the body 200 by the protruding distances of the protrusions 300c, and accordingly, empty spaces defined by the outer peripheral surface of the body 200, the inner peripheral surface of the cover 400, and the plurality of protrusions 300c are formed between the body 200 and the cover 400. The sea water enters the empty spaces to have the heat exchange with the body 200 and the protrusions 300c. However, the present invention may not be limited thereto, and accordingly, the plurality of unit plates 400' connected to the body 200 may be used as the cover 400.

As mentioned above, the cover 400 surroundingly covers the body 200 and the protrusions 300c to protect the underwater data center 10 from floating matters existing underwater.

Figure 7:
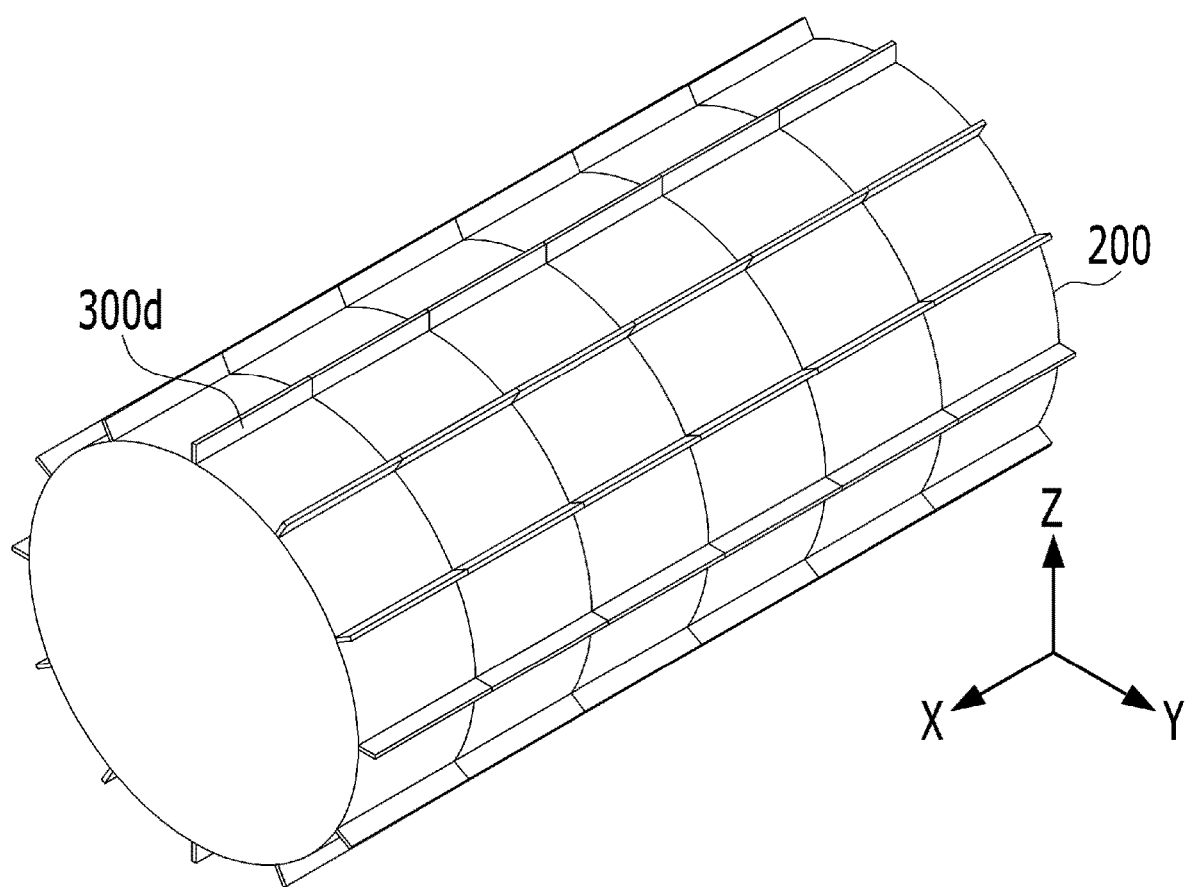
FIG. 7 is a perspective view showing still another example of the body of the underwater data center according to the present invention.
Figure 8A:
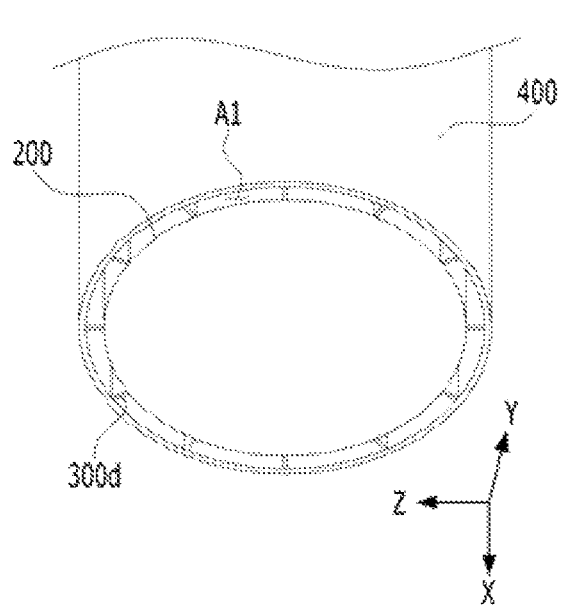
FIGS. 8A and 8B are perspective and top views showing a state where a cover is coupled to the body of FIG. 7.
Figure 8B:
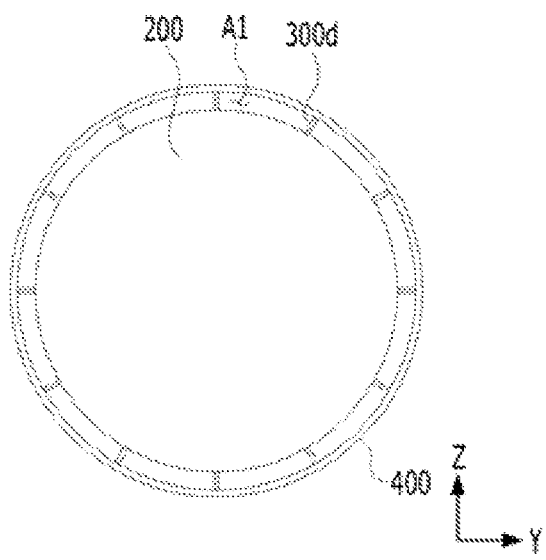
Figure 9A:
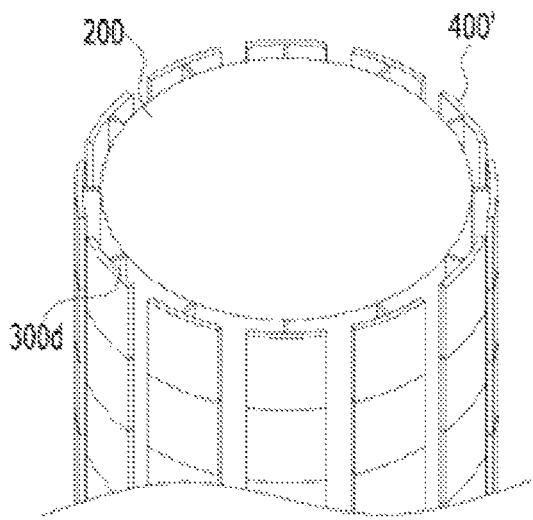
FIGS. 9A and 9B are perspective and top views showing another state where a cover is coupled to the body of FIG. 7.
Figure 9B:
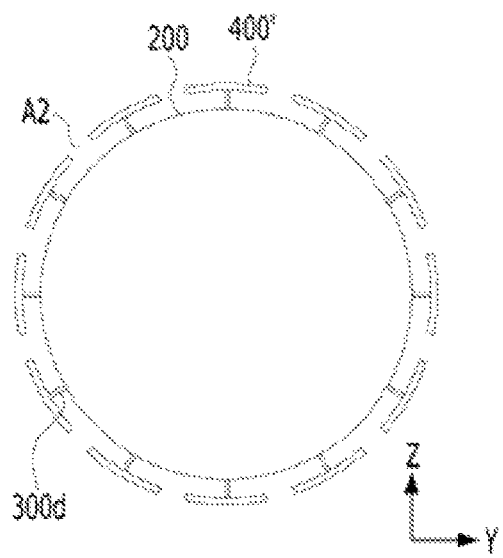
Figure 10:
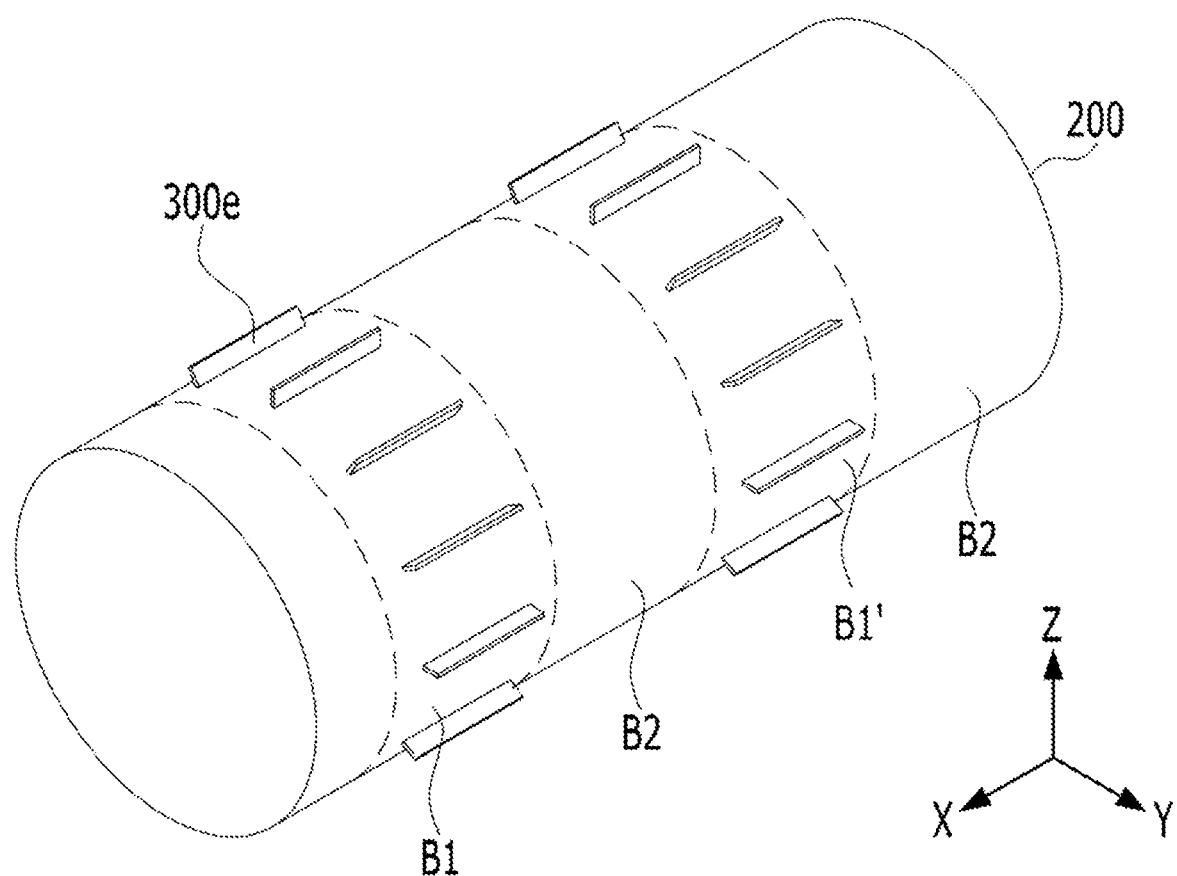
FIG. 10 is a perspective view showing yet still another example of the body of the underwater data center according to the present invention.

FIG. 7 is a perspective view showing still another example of the body of the underwater data center according to the present invention, and FIGS. 8A and 8B are perspective and top views showing a state where the cover is coupled to the body of FIG. 7. FIGS. 9A and 9B are perspective and top views showing another state where the cover is coupled to the body of FIG. 7, and FIG. 10 is a perspective view showing yet still another example of the body of the underwater data center according to the present invention.

Referring to FIG. 7, protrusions 300d protrude radially outward from the outer peripheral surface of the body 200 and extend along the longitudinal direction (in the direction of the X-axis) of the body 200. In this case, the protrusions 300d have lengths equal to or shorter than the length of the body 200. Accordingly, the protrusions 300d are arranged between both side ends of the body 200.

Each protrusion 300d has a protruding length shorter than a diameter of the body 200. In this case, the protruding length is a distance from one end of the protrusion 300d connected to the outer peripheral surface of the body 200 to the end of the protrusion 300d extending radially outward. For example, the protrusion 300d has the protruding distance shorter than the radius of the body 200.

In the same manner as above, the plurality of protrusions 300d are provided. In this case, the plurality of protrusions 300d are arranged on the outer peripheral surface of the body 200 in a circumferential direction of the body 200. In specific, the plurality of protrusions 300d are spaced apart from one another by a given distance. When the body 200 is viewed in the direction (for example, a YZ plane) parallel with the side thereof, it has the shape similar to a gear. In this case, the plurality of protrusions 300d have the same protruding distance as one another.

Referring to FIGS. 8A to 9B, the underwater data center 10 further includes a cover 400. The cover 400 is adapted to surround the body 200 and the protrusions 300d to protect them from the outside. In specific, the cover 400 is provided with the plurality of unit plates 400' curved to the same or similar curvature radius of the body 200.

According to the present invention, as shown in FIGS. 8A and 8B, the cover 400 is provided by connecting the plurality of unit plates 400' to one another. Accordingly, the cover 400 has the shape of a cylinder with a hollow portion passing through the center thereof. In this case, the inner peripheral surface of the cover 400 comes into close contact with the ends of the protrusions 300d so that the cover 400 is connected to the body 200. In this case, the cover 400 completely surrounds the outer peripheral surface of the body 200. In specific, the cover 400 is spaced apart from the body 200 by the protruding distance of each protrusions 300d, and accordingly, empty spaces A1 defined by the outer peripheral surface of the body 200, the inner peripheral surface of the cover 400, and the plurality of protrusions 300d are formed between the body 200 and the cover 400. The sea water enters the empty spaces A1 to have the heat exchange with the body 200 and the protrusions 300d. However, the present invention may not be limited thereto, and accordingly, the cover 400 may be a single structure having the shape of a cylinder with a hollow portion.

According to another embodiment of the present invention, as shown in FIGS. 9A and 9B, the cover 400 has the plurality of unit plates 400' not connected to one another (that is, spaced apart from one another). In this case, the unit plates 400' are connected correspondingly to the ends of the plurality of protrusions 300d. Accordingly, the cover 400 covers portions of the outer peripheral surface of the body 200. In specific, the cover 400 covers the protrusions 300*d* and the portions around the protrusions 300*d* on the outer peripheral surface of the body 200. As a result, areas A2, which are not covered with the cover 400, exist between the neighboring protrusions 300*d*. Accordingly, the heat generated from the underwater data center 10 is emitted to the outside through the areas A2.

Referring to FIG. 10, protrusions 300*e* are arranged between both side ends of the body 200 and protrude radially outward from the outer peripheral surface of the body 200. In this case, each protrusion 300*e* extends along the longitudinal direction (the direction of the X-axis) of the body 200, and the protrusions 300*e* have lengths shorter than the entire length of the body 200. In specific, the protrusions 300*e* have lengths shorter than half of length of the body 200.

Each protrusion 300*e* has a protruding length shorter than a diameter of the body 200. In this case, the protruding length is a distance from one end of the protrusion 300*e* connected to the outer peripheral surface of the body 200 to the end of the protrusion 300*e* extending radially outward. For example, the protrusion 300*e* has the protruding distance shorter than the radius of the body 200.

In the same manner as above, the plurality of protrusions 300*e* are provided. In this case, the plurality of protrusions 300*e* are arranged on the outer peripheral surface of the body 200 in the circumferential direction of the body 200. In specific, the plurality of protrusions 300*e* are spaced apart from one another by a given distance. When the body 200 is viewed in the direction (for example, a YZ plane) parallel with the side thereof, it has the shape similar to a gear.

The plurality of protrusions 300*e* are arranged in series on the outer peripheral surface of the body 200 in the circumferential direction of the body 200 to form protrusion arrangement portions. The protrusion arrangement portions are arranged in the longitudinal direction (the direction of the X-axis) of the body 200. In this case, the protrusion arrangement portions are spaced apart from each other.

Accordingly, the body 200 includes, on the outer peripheral surface thereof, a first area B1 formed by some of the plurality of protrusions 300*e* to locate the first protrusion arrangement portion thereon and a second area B1' formed by the remaining protrusions 300*e* and spaced apart from the first area B1 in the longitudinal direction (in the direction of the X-axis). Further, the body 200 includes, on the outer peripheral surface thereof, third areas B2 formed between the first area B1 and the second area B1' and having no protrusions 300*e* arranged thereon.

In FIG. 10, the first area B1, the second area B1', and the two third areas B2 adjacent to the first area B1 and the second area B1' are shown, but the present invention may not be limited thereto. A larger number of first areas B1, third areas B2, second areas B1', and third areas B2 may be alternately arranged continuously on the outer peripheral surface of the body 200.

The plurality of protrusions 300*e* have the same protruding distance as one another. In this case, the cover 400 is connected to the ends of the protrusions 300*e*. The specific characteristics of the cover 400 are the same as or similar to the cover 400 in the above-mentioned embodiment of the present invention, and therefore, an explanation of the specific characteristics of the cover 400 will be avoided.

As mentioned above, the cover 400 surroundingly covers the body 200 and the protrusions 300*e* to protect the underwater data center 10 from floating matters existing underwater.

As described above, the underwater data center 10 according to the present invention is configured to have the plurality of protrusions 300 formed on the outer peripheral surface of the body 200 adapted to arrange the data processing servers S therein, so that the surface area of the body 200 becomes increased to improve the heat emission performance through the heat exchange with the sea water. Further, the underwater data center 10 according to the present invention is configured to have the cover 400 connected to the ends of the protrusions 300 to surroundingly cover the body 200, so that the surface area of the body 200 is greatly increased and the underwater data center 10 is protected from the collision against the floating matters existing underwater.

As mentioned above, the preferred embodiments of the present invention have been disclosed in the specification and drawings. In the description of the present invention, special terms are used not to limit the present invention and the scope of the present invention as defined in claims, but just to explain the present invention. For example, the parts expressed in a singular form may be dispersedly provided, and in the same manner as above, the parts dispersed may be combined with each other.

Therefore, persons skilled in the relevant art can appreciate that many modifications and variations are possible in light of the above teachings. It is therefore intended that the scope of the invention be limited not by this detailed description, but rather by the claims appended hereto.

What is claimed is:

1. An underwater data center comprising:
    a support configured to be fixed to a bottom of a sea;
    a body disposed on the support and configured to have data processing servers arranged in an internal space thereof, the body having a plurality of protrusions protruding radially outward from an outer peripheral surface thereof, the plurality of protrusions being arranged in a longitudinal direction of the body; and
    a cover adapted to be coupled to ends of the plurality of protrusions to surroundingly cover the outer peripheral surface of the body, while being spaced apart from the body,
    wherein each of the plurality of protrusions has a shape of an elongated pin, the plurality of protrusions being arranged on the outer peripheral surface of the body in a circumferential direction of the body.

2. An underwater data center comprising:
    a support configured to be fixed to a bottom of a sea;
    a body disposed on the support and configured to have data processing servers arranged in an internal space thereof, the body having a plurality of protrusions protruding radially outward from an outer peripheral surface thereof, the plurality of protrusions being arranged in a circumferential direction of the body; and
    a cover adapted to be coupled to ends of the plurality of protrusions to surroundingly cover the outer peripheral surface of the body, while being spaced apart from the body,
    wherein each of the plurality of protrusions extends along a longitudinal direction of the body, while the plurality of protrusions are spaced apart from one another in the circumferential direction of the body.

3. The underwater data center according to claim 2, wherein the body comprises, on the outer peripheral surface thereof, a first area on which some of the plurality of protrusions are disposed, a second area spaced apart from the first area in the longitudinal direction of the body, the second area having remaining ones of the plurality of protrusions thereon, and third area disposed between the first area and the second area and on a portion where no protrusions are arranged.

* * * * *